(12) United States Patent
Ahlers et al.

(10) Patent No.: US 6,639,272 B2
(45) Date of Patent: Oct. 28, 2003

(54) CHARGE COMPENSATION SEMICONDUCTOR CONFIGURATION

(75) Inventors: Dirk Ahlers, München (DE); Armin Willmeroth, Augsburg (DE); Hans Weber, Ainring (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,343

(22) Filed: Apr. 1, 2002

(65) Prior Publication Data

US 2002/0135014 A1 Sep. 26, 2002

Related U.S. Application Data

(63) Continuation of application No. PCT/DE00/03469, filed on Sep. 28, 2000.

(30) Foreign Application Priority Data

Sep. 30, 1999 (DE) .......................................... 199 47 020

(51) Int. Cl.[7] .............................................. H01L 29/76
(52) U.S. Cl. ...................... 257/328; 257/329; 257/492; 257/493; 257/287; 257/266; 257/335; 257/342; 438/212; 438/268; 438/514; 438/549
(58) Field of Search ................................ 257/328, 329, 257/492, 493, 287, 266, 655, 656, 285, 335, 342, 339, 340; 438/212, 268, 188, 199, 514, 549

(56) References Cited

U.S. PATENT DOCUMENTS

| | | | | |
|---|---|---|---|---|
| 4,754,310 A | * | 6/1988 | Coe ............................. | 357/13 |
| 5,216,275 A | * | 6/1993 | Chen .......................... | 257/493 |
| 5,726,469 A | * | 3/1998 | Chen .......................... | 257/285 |
| 6,168,983 B1 | * | 1/2001 | Rumennik et al. .......... | 438/188 |
| 6,207,994 B1 | * | 3/2001 | Rumennik et al. .......... | 257/342 |
| 6,271,562 B1 | * | 8/2001 | Deboy et al. ................ | 257/341 |

FOREIGN PATENT DOCUMENTS

| | | |
|---|---|---|
| DE | 29 34 994 C2 | 7/1989 |
| DE | 196 04 043 A1 | 8/1997 |
| DE | 198 39 970 A1 | 3/2000 |

OTHER PUBLICATIONS

Deboy, G.: "A New Generation of High Voltage MOSFETs Breaks the Limit Line of Silicon", IEEE, 1998, pp. 26.2.1–26.2.3.

* cited by examiner

*Primary Examiner*—Nathan J. Flynn
*Assistant Examiner*—Fazli Erdem
(74) *Attorney, Agent, or Firm*—Laurence A. Greenberg; Werner H. Stemer; Gregory L. Mayback

(57) ABSTRACT

Charge balancing is achieved in a compensation component by creating compensation regions having different thickness. In this manner, the ripple of the electric field can be chosen to have approximately the same magnitude in all of the compensation regions.

12 Claims, 1 Drawing Sheet

CHARGE COMPENSATION SEMICONDUCTOR CONFIGURATION

CROSS-REFERENCE TO RELATED APPLICATION

This application is a continuation of copending International Application No. PCT/DE00/03469, filed Sep. 28, 2000, which designated the United States.

BACKGROUND OF THE INVENTION

Field of the Invention

The present invention relates to a compensation component having a semiconductor body of a first conduction type, in which a region extends between at least one first electrode and a second electrode arranged remote from the first electrode. The region adjoins the first electrode and has at least one zone of the second conduction type that is opposite to the first conduction type. The compensation component includes a drift zone that lies between the at least one zone of the second conduction type and the second electrode. The drift zone has compensation regions of the second conduction type, in which the charge balance is variable.

It is known that in compensation components, the electrical parameters, such as, in particular, the breakdown voltage, are greatly dependent on manufacturing fluctuations. This can be attributed to the fact that the breakdown voltage depends approximately parabolically on the p/n charge balance in the bulk of the semiconductor body. However, this charge balance is subject to manufacturing fluctuations.

If the charge balance is not varied in the individual planes of a compensation component, which are preferably formed by epitaxy, to obtain a homogeneous doping depth profile in the compensation regions of the second conduction type (the so-called "p-type pillar", if the second conduction type is the p conduction type), then this produces a very narrow compensation parabola with only a small opening width. In this case, then, the manufacturing window is relatively small.

However, if there is variation of the charge balance in the individual planes, i.e. if there is variation of the dose implanted per area in the planes, the parabola becomes wider, which provides a larger manufacturing tolerance.

FIG. 5 shows the typical profile of two such "manufacturing parabolas". In this case, the breakdown voltage is plotted as a function of the degree of compensation, which may be p-loaded, n-loaded, or neutral. A significantly narrow manufacturing parabola is produced for a homogeneous pillar doping (cf. the broken line) and for a variable pillar doping (cf. the solid line).

The drift zone of a compensation component (the compensation regions being situated in the drift zone) is preferably implemented by repeatedly depositing a doped epitaxial layer that is respectively followed by a masked implantation with a dopant of the second conduction type. In other words, by way of example, an n-conducting epitaxial layer is applied to an n-conducting semiconductor substrate. A p-conducting compensation region is then produced using a masked implantation in the region of the drift zone. This operation is repeated a number of times.

If the drift zone is produced in this way, then the electric field exhibits great variation with the depth, that is to say in the direction perpendicular to the individual epitaxial layers. This variation of the electric field can be referred to as ripple.

The ripple is based on the distribution of the implanted dose that is inhomogeneous in the depth direction or the vertical direction, and also on a transverse electric field that is established between the compensation regions of the second conduction type and the semiconductor body surrounding the latter, that is to say, in the above example, with the p-type pillar, between the p-conducting regions of the pillar and the n-conducting semiconductor body.

FIG. 4 shows such a field profile in a conventional compensation component. In this case, the electric field strength E is plotted as a function of the component depth d in FIG. 4.

This ripple of the electric field strength K means that the compensation component can take up significantly less voltage than in the case of a "flatter" field profile. In order nevertheless to be able to withstand relatively high voltages, the compensation component must be dimensioned to be relatively thick, which, however, leads to an increased on resistance RDSon between the drain and the source in the case of a compensation component formed as a transistor.

It should be attempted, then, to ensure that compensation components have a wide manufacturing parabola and a low degree of ripple.

The wide manufacturing parabola is achieved by providing a variable doping profile in the drift zone, in the p-type pillar in the above example. For this purpose, either the implantation dose can be set in a variable fashion or the doping in the individual epitaxial layers can be configured in a variable fashion. Such a variable configuration of the doping in epitaxial layers, that is to say the n-type doping in the above example, can only be realized with difficulty in practice, so that solely the variation of the doping dose in the compensation regions is preferred. This variation can be implemented by changing the implanted dose or by correspondingly dimensioning the masks used during the photo technology before the implantation.

The ripple of the electric field can be achieved by providing: longer drive-in times following the individual implantations, that is to say through a more homogeneous distribution of the implanted dopants that are achieved as a result; through the use of high-energy implantations; or through smaller layer thickness of the individual compensation regions, and thus through a larger number of epitaxial layers.

SUMMARY OF THE INVENTION

It is accordingly an object of the invention to provide a compensation component and a method for producing the compensation component which overcome the above-mentioned disadvantages of the prior art apparatus and methods of this general type.

In particular, it is an object of the invention to provide a compensation component that is distinguished by a wide manufacturing parabola and a low degree of ripple of the electric field.

With the foregoing and other objects in view there is provided, in accordance with the invention, a compensation component that includes: at least one first electrode; a second electrode configured remote from the at least one first electrode; a semiconductor body of a first conduction type; a region including at least one zone of a second conduction type that is opposite the first conduction type, the region configured in the semiconductor body and adjoining the first electrode; a drift zone lying between the at least one zone of the second conduction type and the second electrode; and compensation regions of the second conduction type. The compensation regions have different charge balances. The compensation regions are configured near the at least one zone of the second conduction type. At least some of the compensation regions have a dimension that is different from that of others of the compensation regions. The dimension is the layer thickness in the case of a vertically configured compensation component, and is the width in the case of a laterally configured compensation component.

In accordance with an added feature of the invention, the dimension is the layer thickness; and the layer thickness of each one of the compensation regions is different from that of others of the compensation regions.

In accordance with an additional feature of the invention, the dimension is the layer thickness; and the layer thickness of at least two of the compensation regions is different from that of others of the compensation regions.

In accordance with another feature of the invention, each one of the some of the compensation regions has a doping dose that is different from that of the others of the compensation regions.

In accordance with a further feature of the invention, the semiconductor body has a main surface; and the compensation regions are arranged vertically in the semiconductor body with respect to the main surface of the semiconductor body.

In accordance with a further added feature of the invention, the first conduction type is the n conduction type.

In accordance with a further additional feature of the invention, the compensation regions are doped with boron.

In accordance with yet an added feature of the invention, the dimension is the layer thickness; and the layer thickness of each one of the compensation regions is between 5.0 $\mu$m and 15 $\mu$m.

In accordance with yet an additional feature of the invention, the dimension is the layer thickness; and the layer thickness of each one of the compensation regions is between 6.0 $\mu$m and 7.0 $\mu$m.

In accordance with yet a further feature of the invention, the first electrode, the second electrode, the semiconductor body, the region, the drift zone, and the compensation regions define a MOS transistor.

In accordance with another added feature of the invention, the dimension is the layer thickness; and the compensation regions are configured below the at least one zone of the second conduction type.

In accordance with another additional feature of the invention, the dimension is a width; and the compensation regions are configured laterally with respect to the at least one zone of the second conduction type.

With the foregoing and other objects in view there is provided, in accordance with the invention, a method for fabricating a compensation component, which includes steps of: providing a compensation component that includes: at least one first electrode, a second electrode configured remote from the at least one first electrode, a semiconductor body of a first conduction type, a region including at least one zone of a second conduction type that is opposite the first conduction type, the region configured in the semiconductor body and adjoining the first electrode, a drift zone lying between the at least one zone of the second conduction type and the second electrode. The drift zone has compensation regions of the second conduction type. The compensation regions have different charge balances. The compensation regions are configured near the at least one zone of the second conduction type. At least some of the compensation regions having a dimension that is different from that of others of the compensation regions. The method also includes steps of: providing the semiconductor body as a semiconductor substrate; and performing masked implantations one after another on the semiconductor substrate to produce the compensation regions in epitaxially deposited layers.

In the case of a vertically configured compensation component of the type mentioned in the introduction, the object of invention is obtained by virtue of the fact that the thickness of the compensation regions is varied.

The invention provides a further advantageous possibility for achieving a variable doping while at the same time reducing the ripple. In addition to the two customary methods already mentioned above, in the invention, the variable doping is set by varying the thickness of the compensation regions; that is to say, the thickness of the individual epitaxial layers. This has the additional advantage that the ripple of the electric field can readily be chosen to have approximately the same magnitude in all of the compensation regions. If the variable doping were set as previously by way of the dose used during the implantation, then the transverse electric field, and thus the ripple of the electric field is greater in the region where the doping of the second conduction type is predominant than in the remaining regions. This results in the electric field profile that is shown in FIG. 4. When varying the thickness of the compensation regions, which is used in the invention, the variation of the thickness enables the ripple to be configured uniformly over the entire drift zone, so that the compensation component with the invention can be made thinner than in conventional compensation components. This ultimately leads to an improved, i.e. lower, on resistance. A further advantage of the compensation component with the invention is that the thickness of individual deposited epitaxial layers can be set with significantly better reproducibility than the doping thereof. Compensation components for voltages up to 600 V and 800 V can readily be manufactured with identical epitaxial doping using the present invention.

Other features which are considered as characteristic for the invention are set forth in the appended claims.

Although the invention is illustrated and described herein as embodied in a charge compensation semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
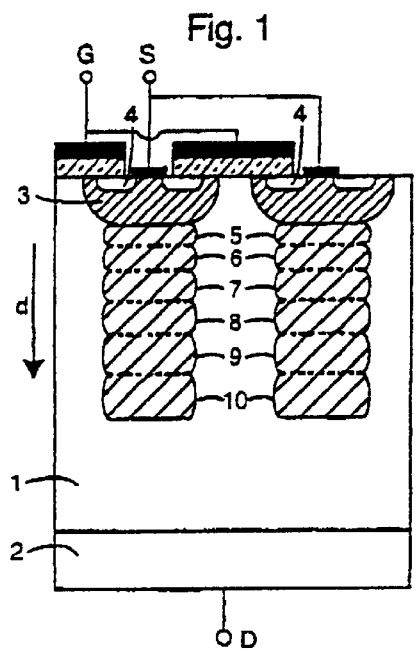
FIG. 1 is a diagrammatic cross-sectional view section through a first exemplary embodiment of a compensation component.

Referring now to the figures of the drawing in detail and first, particularly, to FIG. 1 thereof, there is shown a first exemplary embodiment of a compensation component in the form of a MOS transistor. FIG. 1 is a diagrammatic cross-sectional view through the MOS transistor, which has an n-conducting semiconductor body 1 configured on an n+ conducting semiconductor substrate 2. The MOS transistor also has a p-conducting semiconductor zone 3, n+ conducting source zones 4, an insulator layer made of silicon dioxide, a source electrode S, a gate electrode G, and a drain electrode D.

Situated below the p-conducting zone 3 are p-conducting compensation regions 5 to 10, which, according to the invention, have different thicknesses. The compensation region 5 has a thickness of 6.0 μm, while the compensation regions 6 to 10 respectively have thicknesses of 6.2 μm, 6.4 μm, 6.6 μm, 6.8 μm and 7.0 μm.

In this way, a drift zone is obtained from the compensation regions 5 to 10, in which the charge balance is likewise varied as a result of the variation the thickness of the compensation regions 5 to 10.

Figure 2:
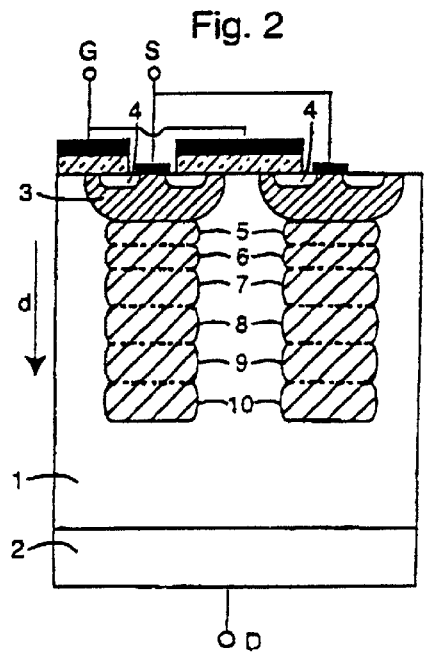
FIG. 2 is a diagrammatic cross-sectional view section through a second exemplary embodiment of the compensation component.
Figure 3:
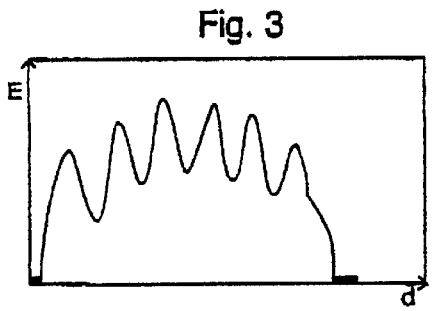
FIG. 3 shows the electric field E as a function of the component depth d in the inventive compensation component.
Figure 4:
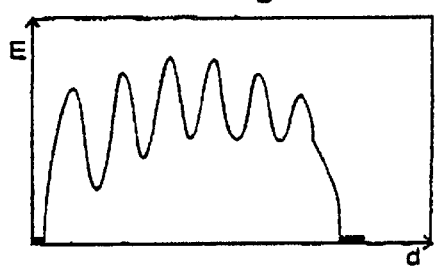
FIG. 4 shows the electric field as a function of the component depth d in a prior art compensation component.
Figure 5:
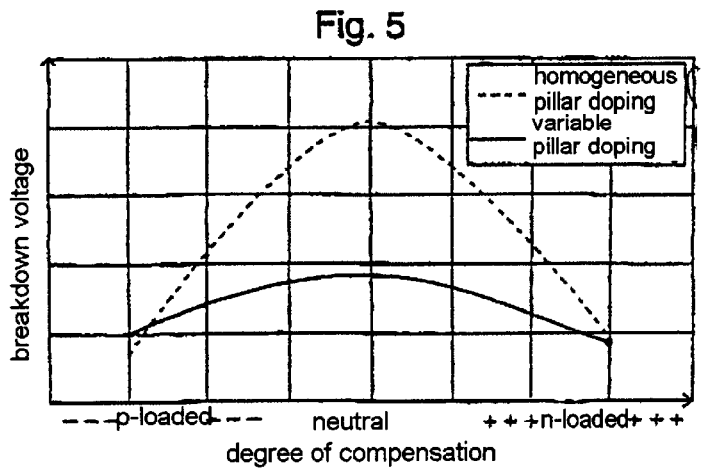
FIG. 5 shows two manufacturing parabolas.

FIG. 3 shows the profile of the electric field E as a function of the depth d for the inventive compensation component illustrated in FIG. 2. FIG. 4 shows the profile of the electric field E as a function of the depth d for a prior art compensation component. Comparing FIG. 3 with FIG. 4 immediately reveals that the ripple of the inventive compensation component is uniform and has approximately the same magnitude in the entire drift zone. As a result, it is possible to make the compensation component thinner and to achieve a reduced on-resistance.

FIG. 1 shows a vertical arrangement of the inventive compensation component. However, the invention is not limited to such a vertical arrangement. Rather, a lateral configuration is also possible, in which it is then possible to achieve the different thickness of the compensation regions, for example, using doping zones of different widths.

However, the inventive compensation component preferably has a vertical structure, as is shown in FIGS. 1 and 2.

The semiconductor substrate 2, the semiconductor body 1 and the individual zones 3 to 10 are preferably composed of silicon. If appropriate, however, other materials are also possible therefore, such as, for example, AIII-BV compound semiconductors.

Aluminium, for example, can be used for the drain D electrode, the gate electrode G and the source electrode S. However, other materials can be used, if appropriate, in this case as well.

FIG. 2 shows a further exemplary embodiment of the inventive compensation component, which differs from the exemplary embodiment shown in FIG. 1 merely by the fact that only some of the layers 5 to 10 have a different thickness. Layer 5 has a thickness of 6.4 μm, layer 6 has a thickness of 6.7 μm, and layers 7 to 10 each have a thickness of 7.0 μm. A variable doping is achieved in this case by choosing different doses during implantation, whereas the layers 5 to 7 are implanted with a dose of "100%", respective p-type doses of 90%, 80% and 70% are provided for the implantation of the layers 8, 9, 10. If appropriate, however, the layers or compensation regions having the varied thickness, similar to the layers with the thickness that are not varied, can also have a varied implantation dose. Instead of implantation, it is possible to use a different doping method, so that the individual layers with at least partly different layer thickness then have different doping concentrations.

Boron is preferably used as the p-conducting dopant. However, if appropriate, it is also possible to use other p-conducting dopants, such as, for example, gallium etc.

Moreover, the invention has been explained above on the basis of a p-type pillar including the compensation regions 5 to 10 in the n-conducting semiconductor body 1. If appropriate the conduction type can also be reversed, so that an n-type pillar is present in a p-conducting semiconductor body.

We claim:

1. A compensation component, comprising:
   at least one first electrode;
   a second electrode configured remote from said at least one first electrode;
   a semiconductor body of a first conduction type;
   a region including at least one zone of a second conduction type that is opposite the first conduction type, said region configured in said semiconductor body and adjoining said first electrode; and
   a drift zone lying between said at least one zone of the second conduction type and said second electrode, said drift zone having compensation regions of the second conduction type, said compensation regions having different charge balances, said compensation regions configured near and below said at least one zone of the second conduction type, and at least some of said compensation regions having a layer thickness that is different from that of others of said compensation regions.

2. The compensation component according to claim 1, wherein:
   said layer thickness of each one of said compensation regions is different from that of others of said compensation regions.

3. The compensation component according to claim 1, wherein:
   said layer thickness of at least two of said compensation regions is different from that of others of said compensation regions.

4. The compensation component according to claim 1, wherein:
   each one of said some of said compensation regions has a doping dose that is different from that of said others of said compensation regions.

5. The compensation component according to claim 1, wherein:
   said semiconductor body has a main surface; and
   said compensation regions are arranged vertically in said semiconductor body with respect to said main surface of said semiconductor body.

6. The compensation component according to claim 1, wherein the first conduction type is the n conduction type.

7. The compensation component according to claim 6, wherein said compensation regions are doped with boron.

8. The compensation component according to claim 1, wherein:
   said layer thickness of each one of said compensation regions is between 5.0 μm and 15 μm.

9. The compensation component according to claim 1, wherein:

said layer thickness of each one of said compensation regions is between 6.0 μm and 7.0 μm.

10. The compensation component according to claim 1, wherein said first electrode, said second electrode, said semiconductor body, said region, said drift zone, and said compensation regions define a MOS transistor.

11. A compensation component, comprising:

at least one first electrode;

a second electrode configured remote from said at least one first electrode;

a semiconductor body of a first conduction type;

a region including at least one zone of a second conduction type that is opposite the first conduction type, said region configured in said semiconductor body and adjoining said first electrode; and a drift zone lying between said at least one zone of the second conduction type and said second electrode, said drift zone having compensation regions of the second conduction type, said compensation regions having different charge balances, said compensation regions configured laterally with respect to said at least one zone of the second conduction type, and at least some of said compensation regions having a width that is different from that of others of said compensation regions.

12. A method for fabricating a compensation component, which comprises:

providing a compensation component that includes:
at least one first electrode;
a second electrode configured remote from said at least one first electrode;
a semiconductor body of a first conduction type;
a region including at least one zone of a second conduction type that is opposite the first conduction type, said region configured in said semiconductor body and adjoining said first electrode; and
a drift zone lying between said at least one zone of the second conduction type and said second electrode, said drift zone having compensation regions of the second conduction type, said compensation regions having different charge balances, said compensation regions configured near and below said at least one zone of the second conduction type, and at least some of said compensation regions having a layer thickness that is different from that of others of said compensation regions;

providing the semiconductor body as a semiconductor substrate; and performing masked implantations one after the other on the semiconductor substrate to produce the compensation regions in epitaxially deposited layers.

* * * * *